(12) United States Patent
Reisner et al.

(10) Patent No.: US 10,033,423 B2
(45) Date of Patent: *Jul. 24, 2018

(54) SYSTEMS, DEVICES AND METHODS RELATED TO STACKED RADIO-FREQUENCY DEVICES

(71) Applicant: SKYWORKS SOLUTIONS, INC., Woburn, MA (US)

(72) Inventors: Russ Alan Reisner, Newbury Park, CA (US); Joel Richard King, Newbury Park, CA (US); Ziv Alon, Thousand Oaks, CA (US); Tin Wai Kwan, Thousand Oaks, CA (US); Aleksey A. Lyalin, Thousand Oaks, CA (US); Xiaodong Xu, Oak Park, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/485,113

(22) Filed: Apr. 11, 2017

(65) Prior Publication Data
US 2017/0338847 A1 Nov. 23, 2017

Related U.S. Application Data

(63) Continuation of application No. 15/142,222, filed on Apr. 29, 2016, now Pat. No. 9,628,134, which is a
(Continued)

(51) Int. Cl.
*H04B 1/44* (2006.01)
*H04B 1/40* (2015.01)
(Continued)

(52) U.S. Cl.
CPC ............ *H04B 1/40* (2013.01); *H01L 23/66* (2013.01); *H01L 25/50* (2013.01); *H01L 29/737* (2013.01); *H03F 1/56* (2013.01); *H03F 3/19* (2013.01); *H03F 3/195* (2013.01); *H03F 3/211* (2013.01); *H03F 3/245* (2013.01); *H04B 1/0458* (2013.01); *H04W 72/0453* (2013.01); *H01L 2223/6611* (2013.01); *H01L 2223/6655* (2013.01);
(Continued)

(58) Field of Classification Search
None
See application file for complete search history.

(56) References Cited

U.S. PATENT DOCUMENTS 5,869,894 A * 2/1999 Degani ............... H01L 23/5385
257/685
5,898,909 A * 4/1999 Yoshihara ............ H01L 23/552
257/E23.114
(Continued)

*Primary Examiner* — Tuan A Tran
(74) *Attorney, Agent, or Firm* — Chang & Hale LLP

(57) ABSTRACT

Systems, devices and methods related to stacked band selection switch devices. In some embodiments, an RF module can include a packaging substrate and a power amplifier (PA) assembly implemented on a PA die mounted on the packaging substrate. The RF module can further include an output matching network (OMN) device mounted on the packaging substrate and a band selection switch device mounted on the OMN device. The OMN device can be configured to provide output matching functionality for at least a portion of the PA assembly.

20 Claims, 17 Drawing Sheets

Related U.S. Application Data continuation of application No. 14/630,236, filed on Feb. 24, 2015, now Pat. No. 9,344,140.

(60) Provisional application No. 61/944,563, filed on Feb. 25, 2014.

(51) Int. Cl.

| | | |
|---|---|---|
| *H03F 3/19* | (2006.01) | |
| *H01L 29/737* | (2006.01) | |
| *H04W 72/04* | (2009.01) | |
| *H01L 23/66* | (2006.01) | |
| *H03F 3/24* | (2006.01) | |
| *H03F 3/195* | (2006.01) | |
| *H01L 25/00* | (2006.01) | |
| *H03F 1/56* | (2006.01) | |
| *H03F 3/21* | (2006.01) | |
| *H04W 84/04* | (2009.01) | |
| *H04B 1/04* | (2006.01) | |

(52) U.S. Cl.
CPC ............ *H01L 2223/6677* (2013.01); *H01L 2223/6683* (2013.01); *H01L 2224/05554* (2013.01); *H01L 2224/16225* (2013.01); *H01L 2224/48091* (2013.01); *H01L 2224/48137* (2013.01); *H01L 2224/48145* (2013.01); *H01L 2224/48227* (2013.01); *H01L 2224/49171* (2013.01); *H03F 2200/111* (2013.01); *H03F 2200/451* (2013.01); *H03F 2200/534* (2013.01); *H03F 2203/21106* (2013.01); *H03F 2203/21139* (2013.01); *H03F 2203/21142* (2013.01); *H04B 2001/0408* (2013.01); *H04W 84/042* (2013.01)

(56) References Cited

U.S. PATENT DOCUMENTS

| | | | | |
|---|---|---|---|---|
| 6,628,178 | B2 * | 9/2003 | Uchikoba | H01L 24/97 257/728 |
| 7,167,688 | B2 * | 1/2007 | Li | H04B 1/38 455/106 |
| 7,245,884 | B2 * | 7/2007 | Oida | H01L 23/552 257/E23.114 |
| 7,514,774 | B2 * | 4/2009 | Leung | H01L 23/5385 257/668 |
| 7,656,030 | B2 * | 2/2010 | Osone | H01L 23/3121 257/706 |
| 7,706,756 | B2 * | 4/2010 | Sato | H03F 3/195 333/100 |
| 8,253,245 | B2 * | 8/2012 | Ono | H01L 23/48 257/252 |
| 8,422,972 | B2 * | 4/2013 | Furutani | H04B 1/48 455/269 |
| 8,546,927 | B2 * | 10/2013 | Shiroki | G06K 19/07754 257/679 |
| 8,736,031 | B2 * | 5/2014 | Lee | H01Q 1/2283 257/659 |
| 9,048,284 | B2 * | 6/2015 | McPartlin | H01L 29/7378 |
| 9,064,746 | B2 * | 6/2015 | Crandall | H01L 27/1211 |
| 2005/0180122 | A1 * | 8/2005 | Okabe | H01L 23/66 361/803 |
| 2006/0276158 | A1 * | 12/2006 | Okabe | H04B 1/38 455/333 |
| 2009/0189269 | A1 * | 7/2009 | Leung | H01L 23/66 257/690 |
| 2010/0178879 | A1 * | 7/2010 | Sato | H03F 3/195 455/78 |
| 2013/0130630 | A1 * | 5/2013 | Crandall | H01L 27/1211 455/73 |
| 2015/0171109 | A1 * | 6/2015 | Blin | H01L 27/1203 257/347 |

* cited by examiner

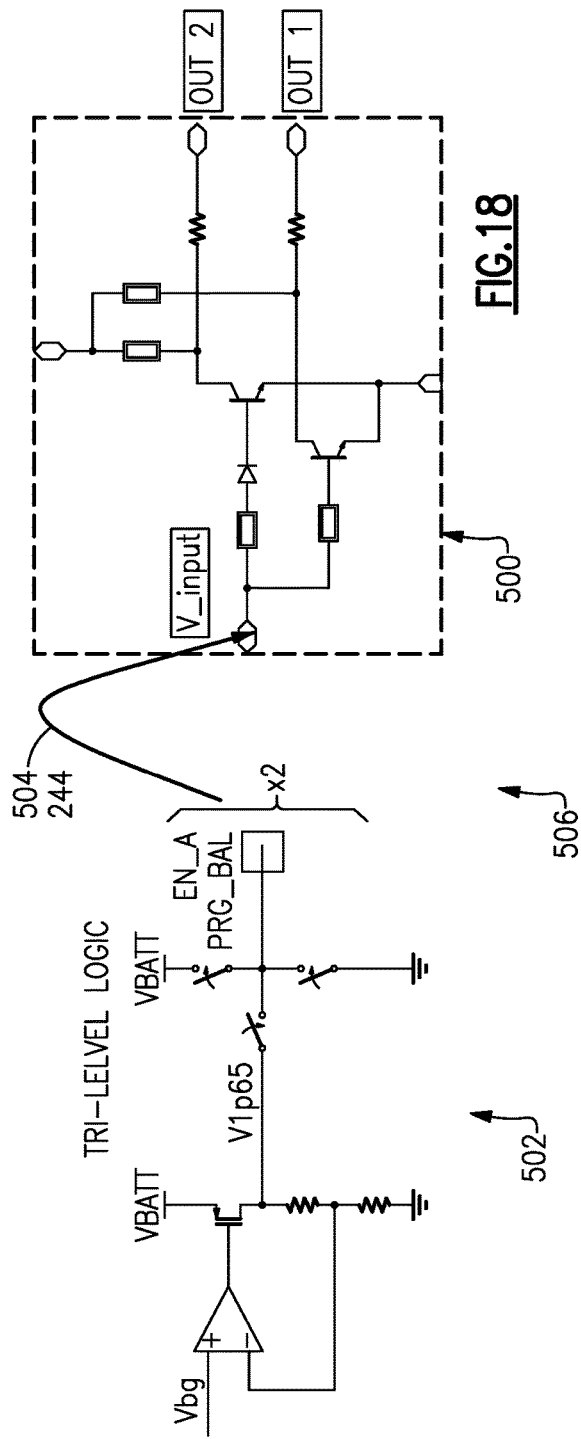

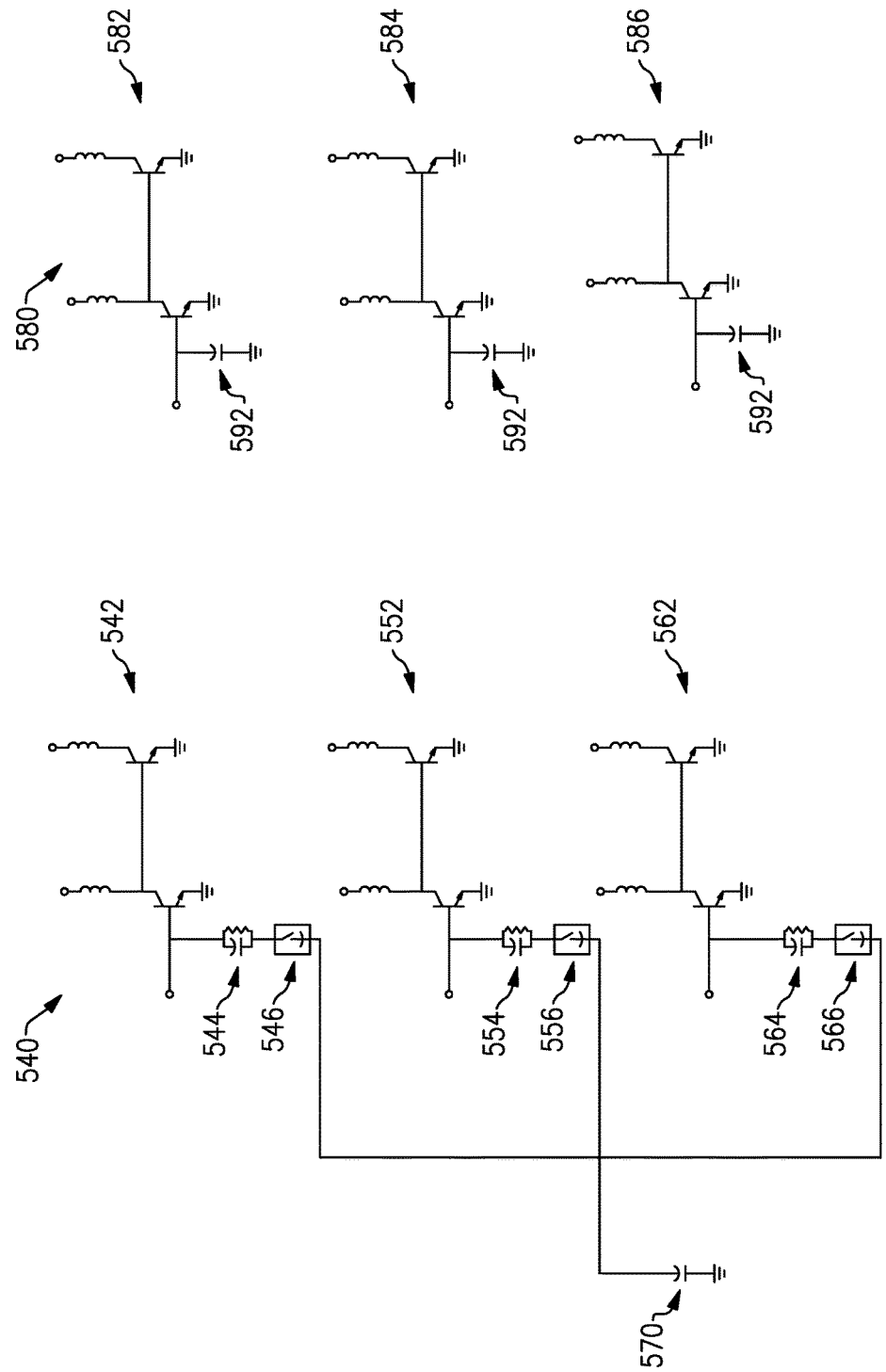

SYSTEMS, DEVICES AND METHODS RELATED TO STACKED RADIO-FREQUENCY DEVICES

CROSS-REFERENCE TO RELATED APPLICATION(S)

This application is a continuation of U.S. patent application Ser. No. 15/142,222, filed Apr. 29, 2016, entitled SYSTEMS, DEVICES AND METHODS RELATED TO STACKED BAND SELECTION SWITCH DEVICES, which is a continuation of U.S. patent application Ser. No. 14/630,236, filed Feb. 24, 2015, entitled SYSTEMS, DEVICES AND METHODS RELATED TO IMPROVED RADIO-FREQUENCY MODULES, which claims priority to U.S. Provisional Patent Application No. 61/944,563, filed Feb. 25, 2014, entitled SYSTEMS, DEVICES AND METHODS RELATED TO IMPROVED RADIO-FREQUENCY MODULES, the disclosures of both which are hereby expressly incorporated by reference herein in their entirety.

BACKGROUND

Field

The present disclosure relates to radio-frequency (RF) modules.

Description of the Related Art

In radio-frequency (RF) applications, circuits and components for providing functionalities such as transmission of amplified signals and/or processing of received signals can be implemented as parts of a packaged module. Such a module can then be mounted on a circuit board such as a phone board.

SUMMARY

In accordance with some implementations, the present disclosure relates to a radio-frequency (RF) module that includes a packaging substrate configured to receive a plurality of components. The RF module further includes a power amplifier (PA) assembly implemented on a first die mounted on the packaging substrate, and a controller circuit implemented on a second die mounted on the first die. The controller circuit is configured to provide at least some control of the PA assembly. The RF module further includes one or more output matching network (OMN) devices mounted on the packaging substrate and configured to provide output matching functionality for the PA assembly. The RF module further includes a band selection switch device mounted on each OMN device.

In some embodiments, the first die can be a gallium arsenide (GaAs) die. The GaAs die can be configured for implementation of a plurality of heterojunction bipolar transistor (HBT) PAs. The HBT PAs can include a plurality of PAs configured for 3G/4G operation. The PAs configured for 3G/4G operation can include four or more PAs. The HBT PAs can further include a plurality of PAs configured for 2G operation.

In some embodiments, the second die can be a silicon (Si) die. The controller circuit can include control functionality for either or both of 3G/4G operation and 2G operation.

In some embodiments, the GaAs die and the Si die can be interconnected by a plurality of wirebonds. In some embodiments, the Si die and the packaging substrate can be interconnected by a plurality of wirebonds. In some embodiments, the GaAs die and the packaging substrate can be interconnected by a plurality of wirebonds.

In some embodiments, the one or more OMN devices can include a first OMN device configured for 3G/4G operation. The first OMN device can be an integrated passive device (IPD) implemented in a flip-chip configuration. The IPD flip-chip device can include a surface opposite from a mounting side, with the surface being configured to receive the band selection switch device. The band selection switch device is implemented on a die such as a silicon-on-insulator (SOI) die. In some embodiments, the band selection switch die and the packaging substrate can be interconnected by a plurality of wirebonds.

In some embodiments, the RF module can further include a tuning circuit implemented on the surface of the IPD flip-chip device. The tuning circuit can be implemented as an IPD. The tuning circuit can include a harmonic tank circuit.

In some embodiments, the controller circuit on the second die and the band selection switch die can be interconnected by one or more flying wirebonds.

In some embodiments, the packaging substrate can include a laminate packaging substrate. The laminate packaging substrate can include a first number of laminate layers, with the first number being less than a second number of laminate layers associated with a module without the one or more OMN devices.

In some embodiments, the RF module can further include a plurality of duplexers mounted on the packaging substrate. The RF module can further include a plurality of filter devices mounted on the packaging substrate. At least some of the filter devices can be configured to facilitate RF shielding between a first region and a second region on the packaging substrate.

In a number of teachings, the present disclosure relates to a method for fabricating a radio-frequency (RF) module. The method includes providing or forming a packaging substrate configured to receive a plurality of components. The method further includes mounting a power amplifier (PA) die on the packaging substrate, and stacking a controller circuit die on the PA die. The method further includes mounting one or more output matching network (OMN) devices on the packaging substrate, and stacking a band selection switch on each OMN device.

In some implementations, the present disclosure relates to a wireless device that includes a transceiver configured to generate a radio-frequency (RF) signal, and a front-end module (FEM) in communication with the transceiver. The FEM includes a packaging substrate configured to receive a plurality of components, a power amplifier (PA) assembly implemented on a first die mounted on the packaging substrate, with the PA assembly being configured to amplify the RF signal. The FEM further includes a controller circuit implemented on a second die mounted on the first die, with the controller circuit being configured to provide at least some control of the PA assembly. The FEM further includes one or more output matching network (OMN) devices mounted on the packaging substrate and configured to provide output matching functionality for the PA assembly, and a band selection switch device mounted on each OMN device. The wireless device further includes an antenna in communication with the FEM and configured to transmit the amplified RF signal.

In some embodiments, the FEM can further include a plurality of duplexers such that the FEM is a FEM-including-duplexer (FEMiD).

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 18 shows a more specific example of the interconnect configuration that can be implemented.

FIG. 19 shows examples of tri-level logic states that can be utilized to facilitate operation of the interconnect example of FIG. 18.

FIG. 23A shows an example PA configuration where a Y1 capacitance can be shared among a plurality of PAs.

FIG. 23B shows an example PA configuration where each of three example PAs can have its own separate Y1 capacitance.

DETAILED DESCRIPTION OF SOME EMBODIMENTS

The headings provided herein, if any, are for convenience only and do not necessarily affect the scope or meaning of the claimed invention.

Designs for wireless devices continue to call for smaller form-factors in various components, including power amplifier (PA) circuits and other radio-frequency (RF) circuits, while maintaining high performance levels. For example, PA-including-duplexer (PAiD) modules with smaller form-factors and high power added efficiency (PAE) specifications are desirable. Such features can apply to, for example, average-power-tracking (APT) and envelope-tracking (ET) 3G/4G PA applications.

Figure 1:
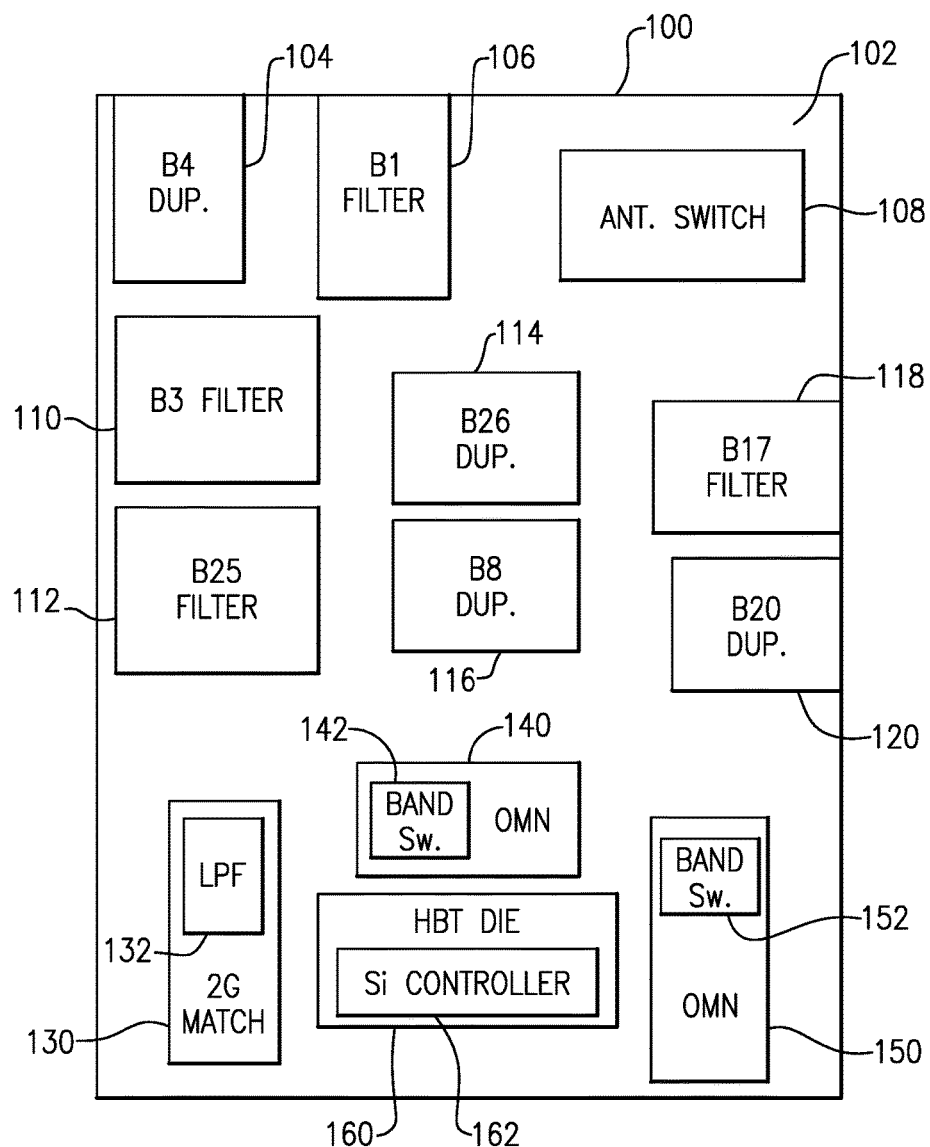
FIG. 1 depicts a module having a number of components that can facilitate transmission and/or reception of radio-frequency (RF) signals.

FIG. 1 schematically depicts a module 100 having a number of components that can facilitate transmission and/or reception of RF signals. The module 100 is shown to include a packaging substrate 102 configured to receive a plurality of components. Such a packaging substrate can include, for example, a laminate substrate. Although various examples are described in the context of such a laminate substrate, it will be understood that one or more features of the present disclosure can also be implemented utilizing other types of packaging substrates.

The module 100 is shown to include a PA die 160 such as a gallium arsenide (GaAs) die implemented in a heterojunction bipolar transistor (HBT) process technology. Although described in the context of HBT PAs, it will be understood that one or more features of the present disclosure can also be implemented in other types of PA die, including other types of semiconductor materials and/or other transistor process technologies.

FIG. 1 shows that a controller circuit implemented on a silicon (Si) die 162 can be mounted on the HBT PA die 160. Examples related to such a configuration, where a Si controller die 162 is mounted on an HBT PA die 160, are described herein in greater detail.

The module 100 is shown to further include an output matching network (OMN) device 140, and OMN device 150. As described herein, a band switch circuit can be implemented and stacked over some or all of such OMN devices. More particularly, a switch circuit die 142 is shown to be stacked over the OMN device 140; and a switch circuit die 152 is shown to be stacked over the OMN device 150. Examples related to such a configuration, where a switch circuit die (142 or 152) is mounted on an OMN device (140 or 150), are described herein in greater detail.

In some embodiments, the OMN devices 140, 150 can be configured to provide matching functionality for 3G/4G bands. Examples of such 3G/4G bands are described herein in greater detail.

In some embodiments, the module 100 can further includes a matching network device 130 for 2G bands. A filter device such as a low-pass filter (LPF) 132 is shown to be stacked over the 2G matching network device 130.

In FIG. 1, a plurality of filter devices and a plurality of duplexer devices are also shown to be mounted on the packaging substrate 102. For example, band-pass filters for band B1 (106), band B3 (110), band B17 (118) and band B25 (112) are shown to be mounted on the packaging substrate 102. In another example, duplexers for band B4 (104), band B8 (116), band B20 (120) and band B26 (114) are shown to be mounted on the packaging substrate 102. Although described in the example context of such bands, it will be understood that one or more features of the present disclosure can also be applied to modules having more or less bands, as well as modules having other combinations of bands.

In some embodiments, the HBT PA die 160 of FIG. 1 can include multiple PAs to facilitate 3G/4G operations. For example, four PAs can be implemented instead of two PAs to achieve better performance over multiple bands. In the multiple-PA configuration (e.g., four PAs), each PA can be designed for a relatively narrow bandwidth. Accordingly, RF signal conditioning circuits such as harmonic traps and inter-stage matching networks can be implemented in a more efficiently tuned manner.

Figure 2:
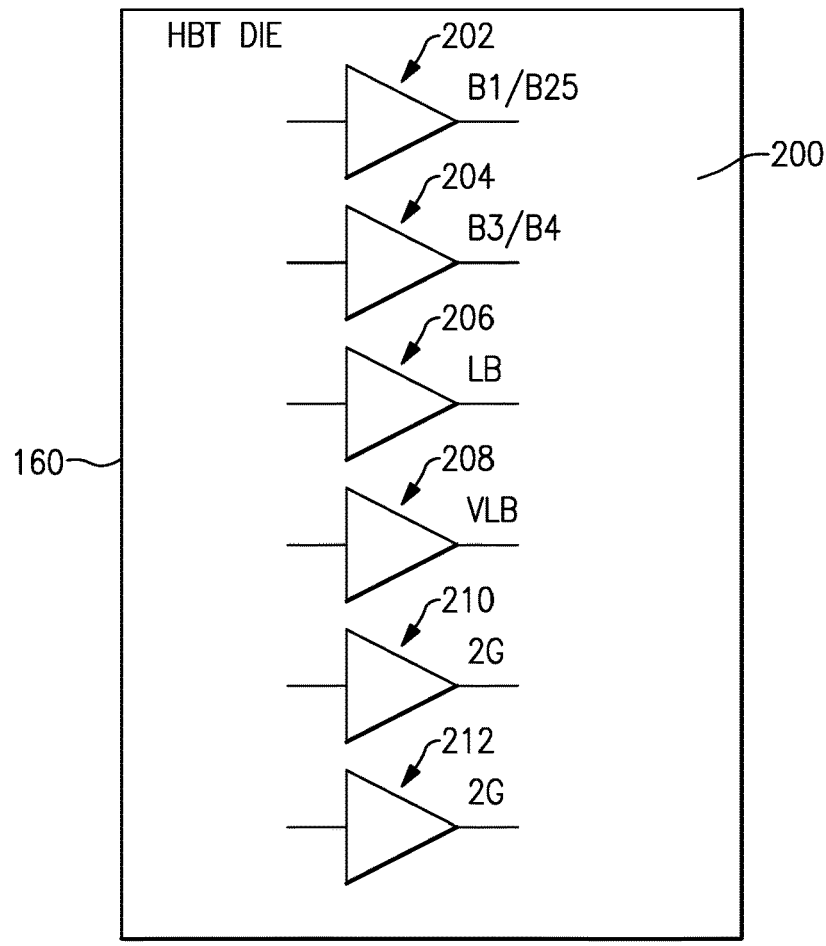
FIG. 2 shows an example power amplifier (PA) die having multiple PAs configured for 3G/4G operations implemented on, for example, a semiconductor substrate such as a gallium arsenide (GaAs) substrate.

FIG. 2 shows an example HBT PA die 160 having multiple PAs configured for 3G/4G operations implemented on, for example, a GaAs substrate 200. For example, a PA 202 can be configured for operation in B1 and B25 bands; a PA 204 can be configured for operation in B3 and B4 bands; a PA 206 can be configured for low band (LB) operation; and a PA 208 can be configured for very low band (VLB) operation. Although described in such example bands, it will be understood that the HBT PA die 160 can include more or less number of 3G/4G PAs, and such PAs can be configured for operations in other combinations of bands.

In the example of FIG. 2, one or more PAs for 2G operations can be implemented on the GaAs substrate 200. For example, two 2G PAs (210, 212) can be implemented; and such PAs can facilitate operations in legacy 2G bands.

Figure 3:
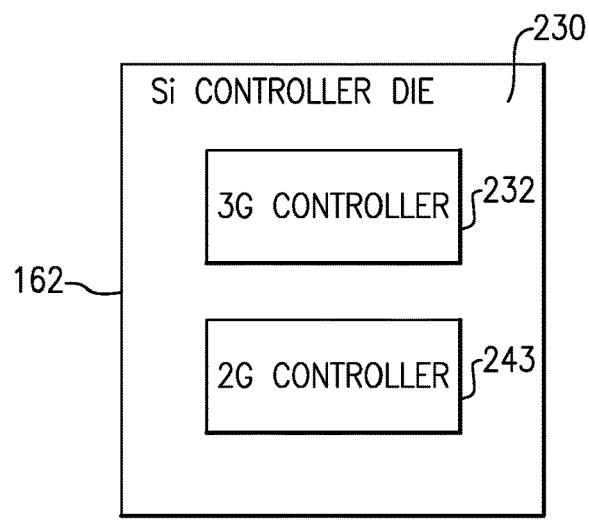
FIG. 3 shows an example die having one or more controller circuits implemented on, for example, a silicon (Si) substrate.

FIG. 3 shows an example die 162 having one or more controller circuits implemented on, for example, a silicon (Si) substrate 230. For example, a controller circuit 232 can be configured for 3G/4G operations; and a controller circuit 234 can be configured for 2G operations. Although described in the context of such two controller circuits, it will be understood that more or less number of controller circuits can be implemented on the Si controller die 162.

As described in reference to FIG. 2, the example HBT PA die 160 can include six PAs, with four being configured for 3G/4G operations, and two being configured for 2G operations. As described in reference to FIG. 3, the example Si controller die 162 can include two controller circuits for the six PAs of the HBT PA die 160, with one being configured to control the four 3G/4G PAs, and the other being configured to control the two 2G PAs.

Figure 4:
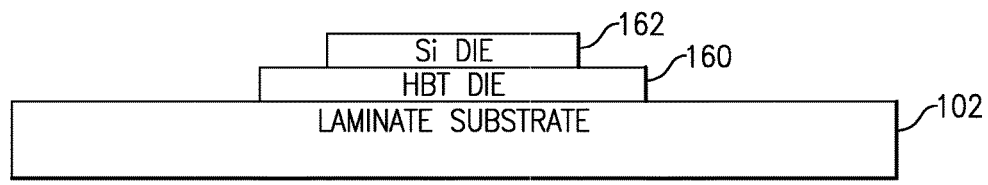
FIG. 4 shows a configuration where a PA die mounted on a laminate packaging substrate, and a Si controller die is mounted on the PA die.
Figure 5A:
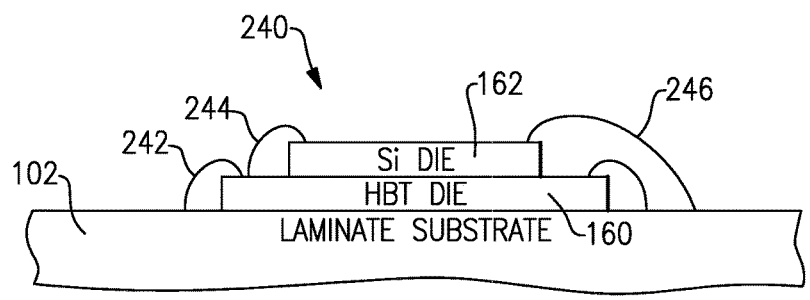
FIGS. 5A and 5B show side and plan views of an example configuration where connections among the Si controller die, the PA die, and the laminate substrate of FIG. 4 can be implemented as wirebonds.
Figure 5B:
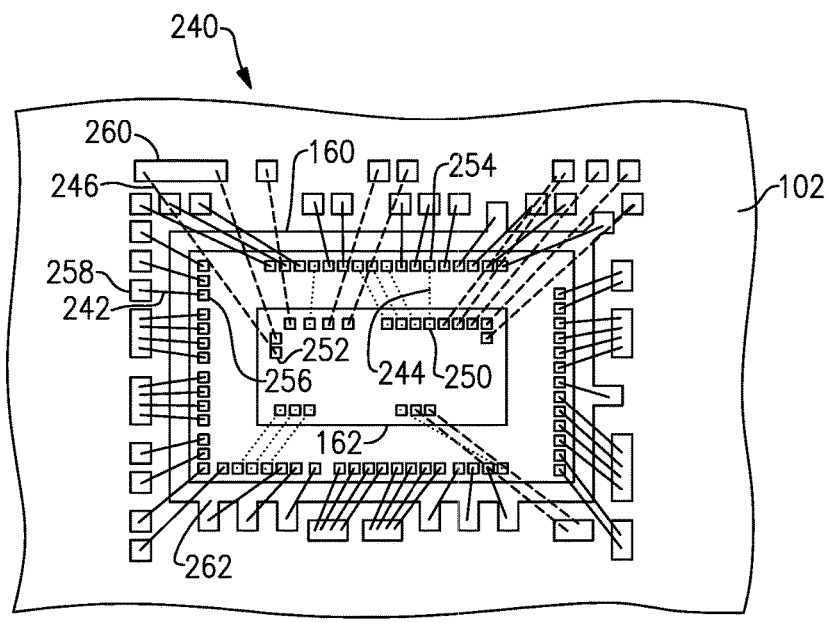

FIG. 4 shows that in some embodiments, the HBT PA die 160 can be mounted on a packaging substrate such as a laminate substrate 102, and the Si controller die 162 can be stacked over the HBT PA die 160. FIGS. 5A and 5B show side and plan views of an example configuration for the foregoing stack of HBT PA die 160 and the Si controller die 162, as well as electrical connections that can be formed to facilitate various operations.

In the example of FIG. 4, the HBT PA die 160 is shown to be mounted on the laminate packaging substrate 102. The Si controller die 162 is shown to be mounted on the HBT PA die 160. The HBT PA die 160 can be configured in a number of ways, including, for example, wirebonding configuration where electrical connections can include wirebonds. Although described in the context of such a wirebonding configuration, it will be understood that one or more features of the present disclosure can also be implemented in other die configurations for the HBT PA die 160.

The Si controller die 162 can be configured in a number of ways, including, for example, wirebonding configuration where electrical connections can include wirebonds. Although described in the context of such a wirebonding configuration, it will be understood that one or more features of the present disclosure can also be implemented in other die configurations for the Si controller die 162.

FIGS. 5A and 5B show side and plan views of an example configuration 240 where connections among the Si controller die 162, the HBT PA die 160, and the laminate substrate 102 are implemented as wirebonds. For example, and as depicted in a simplified view of FIG. 5A, wirebonds 244 can be formed between the Si controller die 162 and the HBT PA die 160 to provide various electrical connections. Electrical connections between the HBT PA die 160 and the laminate substrate 102 can be provided by wirebonds 242. Direct electrical connections between the Si controller die 162 and the laminate substrate 102 can be provided by wirebonds 246.

As shown in an example layout configuration of FIG. 5B, the foregoing wirebond connections can be formed between contact pads formed on the Si controller die 162, the HBT PA die 160, and the laminate substrate 102. In the example shown in FIG. 5B, wirebonds 242 between the HBT PA die 160 and the laminate substrate 102 are depicted as solid lines; and such wirebonds can be formed between contact pads 256 formed on the HBT PA die 160 and contact pads 258 formed on the laminate substrate 102. Wirebonds 244 between the Si controller die 162 and the HBT PA die 160 are depicted as dotted lines; and such wirebonds can be formed between contact pads 250 formed on the Si controller die 162 and the HBT PA die 160. Wirebonds 246 between the Si controller die 162 and the laminate substrate 102 are depicted as dashed lines; and such wirebonds can be formed between contact pads 252 formed on the Si controller die 162 and contact pads 260 formed on the laminate substrate 102.

As further shown in an example layout configuration of FIG. 5B, a ground pad 262 can be provided on the laminate substrate 102 so as to allow grounding connections to be formed from the HBT PA die 160 and/or the Si controller die 162. Further, it will be understood that wirebond lengths and contact pad arrangements can be configured to provide, for example, desired inductances in some electrical connections. For example, it may be desirable to provide a plurality of wirebonds to a common contact pad to yield desired inductance in the connection.

Figure 6:
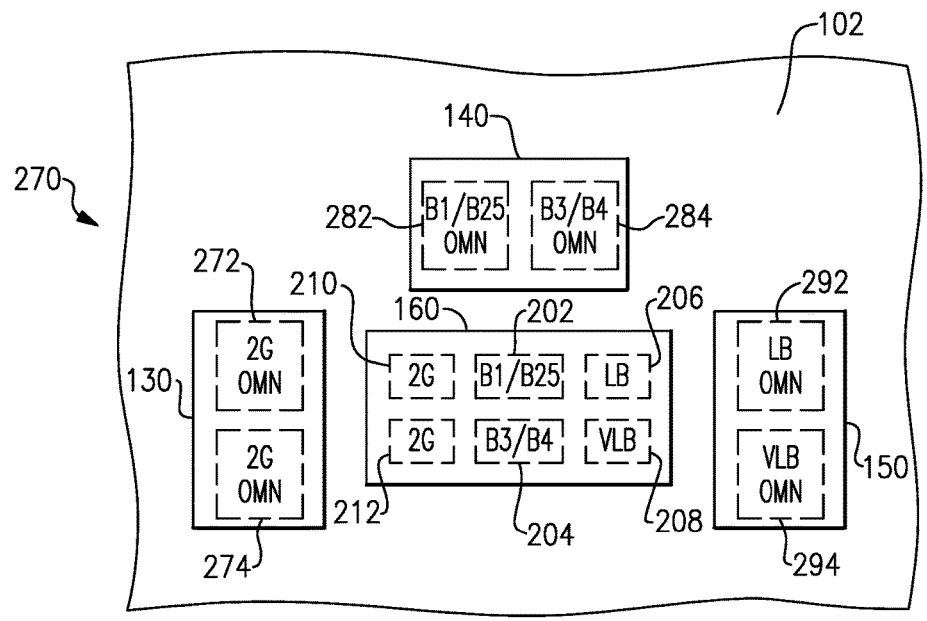
FIG. 6 shows an example configuration of various circuits that can be implemented in matching network devices.

FIG. 6 shows an example configuration 270 of various circuits that can be implemented in the matching network devices 130, 140, 150. The 2G matching network device 130 is shown to include two 2G output matching network (OMN) circuits 272, 274. Each of the two 3G/4G OMN devices 140, 150 can include two OMN circuits, such that the two OMN devices 140, 150 covers the example 3G/4G bands as described herein. For example, the first OMN device 140 can include OMN circuits 282, 284 configured to provide matching functionalities for the B1/B25 and B3/B4 bands. The second OMN device 150 can include OMN circuits 292, 294 configured to provide matching functionalities for the low band (LB) and the very low band (VLB).

In FIG. 6, the HBT PA die 160 is depicted as including the four PA circuits 202, 204, 206, 208 corresponding to the foregoing 3G/4G bands, and the two PA circuits 210, 212 corresponding to the 2G bands. In some embodiments, the matching network devices 130, 140, 150 can be positioned relatively close to the HBT PA die 160. The respective OMN circuits and PAs can be configured such that the output arrays of the respective PA stages are closely spaced and aligned with the input ports of the OMN circuits. Such a configuration can allow RF signal paths to be shorter, thereby reducing losses.

Figure 7:
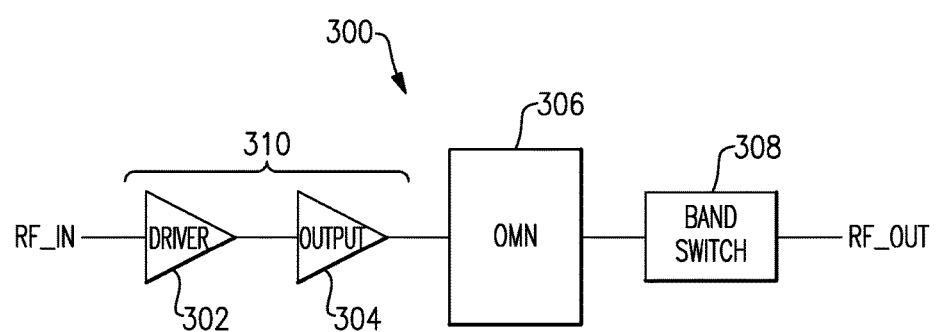
FIG. 7 depicts an example path that an RF signal can travel through during an amplification process.

FIG. 7 schematically depicts an example path that an RF signal can travel through during an amplification process. An input signal (RF_IN) is shown to be received by a PA 310 that can include, for example, a driver stage 302 and an output stage 304. In some embodiments, an inter-stage matching network can be provided between the two example stages. The amplified RF signal from the output stage 304 is shown to be output as RF_OUT through an output matching network (OMN) 306 and a band selection switch 308. As described in reference to FIG. 6, the OMN devices can be configured and be positioned appropriately relative to the PA die such that the outputs of the output-stages are relatively close to the inputs of the OMN circuits.

As shown in FIG. 7, it can be desirable to have the band selection switch 308 be relatively close to the OMN 306. As described herein, such a band selection switch can be stacked over an OMN device to provide such proximity, as well as to reduce the overall lateral area of a module.

Figure 8:
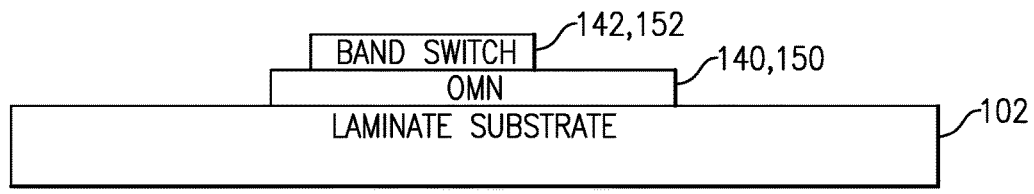
FIG. 8 shows that an output matching network (OMN) device can be mounted on the laminate substrate, and a corresponding band selection switch can be stacked over the OMN device.
Figure 9A:
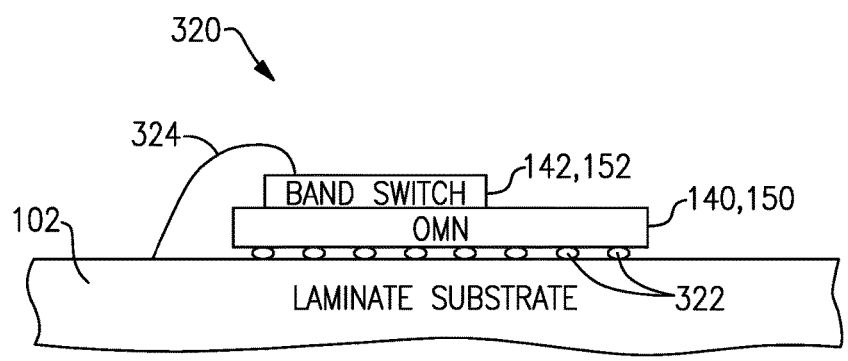
FIGS. 9A and 9B show side and plan views of an example configuration where connections among the band selection switch, the OMN device, and the laminate substrate can be implemented as flip-chip connections and wirebonds.
Figure 9B:
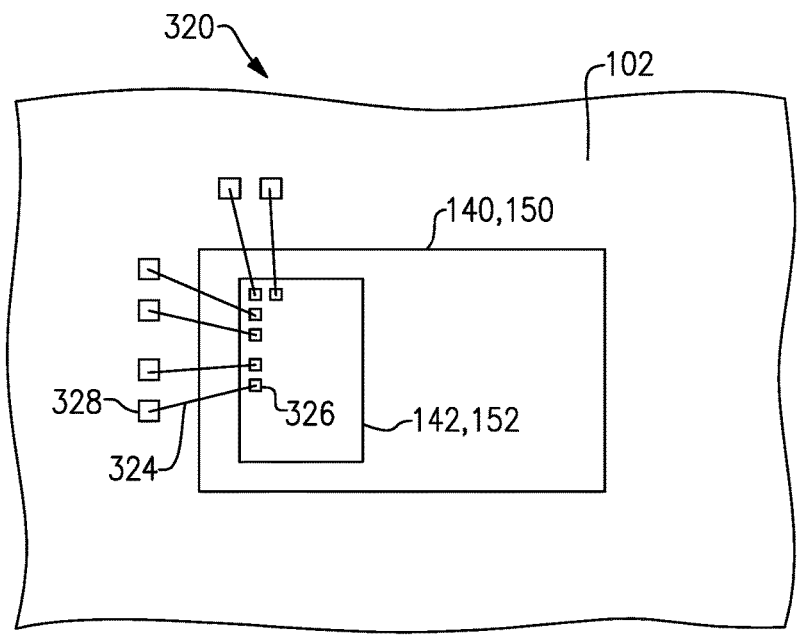

FIG. 8 shows that either or both of the OMN devices 140, 150 of FIGS. 1 and 6 can be mounted on the packaging substrate such as a laminate substrate 102, and their respective band selection switches 142, 152 can be stacked over the OMN devices 140, 150. FIGS. 9A and 9B show side and plan views of an example configuration for the foregoing stack of OMN device (140 or 150) and the band selection switch (142 or 152), as well as electrical connections that can be formed to facilitate various operations.

In FIG. 8, the OMN device (140 or 150) is shown to be mounted on the laminate packaging substrate 102. The band selection switch (142 or 152) is shown to be mounted on the OMN device. Either or both of the OMN devices 140, 150 can be configured in a number of ways, including, for example, flip-chip configuration where electrical connections are generally made through bump solders. Although described in the context of such a flip-chip configuration, it will be understood that one or more features of the present disclosure can also be implemented in other configurations for the OMN devices 140, 150. The band selection switches 142, 152 can be configured in a number of ways, including, for example, as a die with wirebonding configuration where electrical connections can include wirebonds. Although described in the context of such a wirebonding configuration, it will be understood that one or more features of the present disclosure can also be implemented in other die configurations for the band selection switches 142, 152.

Examples of OMN circuits and devices that can be implemented as the OMN devices (e.g., 140, 150) as described herein are described in U.S. Patent Application Publication No. 2014/0320205 entitled AUTOTRANSFORMER-BASED IMPEDANCE MATCHING CIRCUITS AND METHODS FOR RADIO-FREQUENCY APPLICATIONS, which is expressly incorporated by reference in its entirely, and which is to be considered part of the specification of the present application.

FIGS. 9A and 9B show side and plan views of an example configuration 320 where connections among the band selection switch (142 or 152), the OMN device (140 or 150), and the laminate substrate 102 are implemented as flip-chip connections and wirebonds. For example, and as depicted in a simplified view of FIG. 9A, wirebonds 324 can be formed between the band selection switch (142 or 152) and the laminate substrate 102 to provide various electrical connections. Electrical connections and mechanical mounting functionality between the OMN device (140 or 150) and the laminate substrate 102 can be provided by bump solders 322.

As shown in an example layout configuration of FIG. 9B, the foregoing wirebond connections can be formed between contact pads formed on the band selection switch die (142 or 152) and the laminate substrate 102. In the example shown in FIG. 9B, wirebonds 324 between the band selection switch die (142 or 152) and the laminate substrate 102 can be formed between contact pads 326 formed on the band selection switch die and contact pads 328 formed on the laminate substrate 102.

In some embodiments, either or both of the OMN devices 140, 150 can be implemented as an integrated passive device (IPD) packaged in a flip-chip configuration. When mounted to the laminate substrate 102 as shown in FIG. 9A, the upper surface of the OMN devices (140 or 150) can provide a mounting surface for the corresponding band selection switch die (142 or 152).

In some embodiments, the 2G matching network device 130 (e.g., in FIGS. 1 and 6) can be implemented as a non-flip-chip IPD, and such an IPD can be configured to provide the example matching functionalities as described in reference to FIG. 6, and also include the example filtering functionality as described in reference to FIG. 1.

Figure 10A:
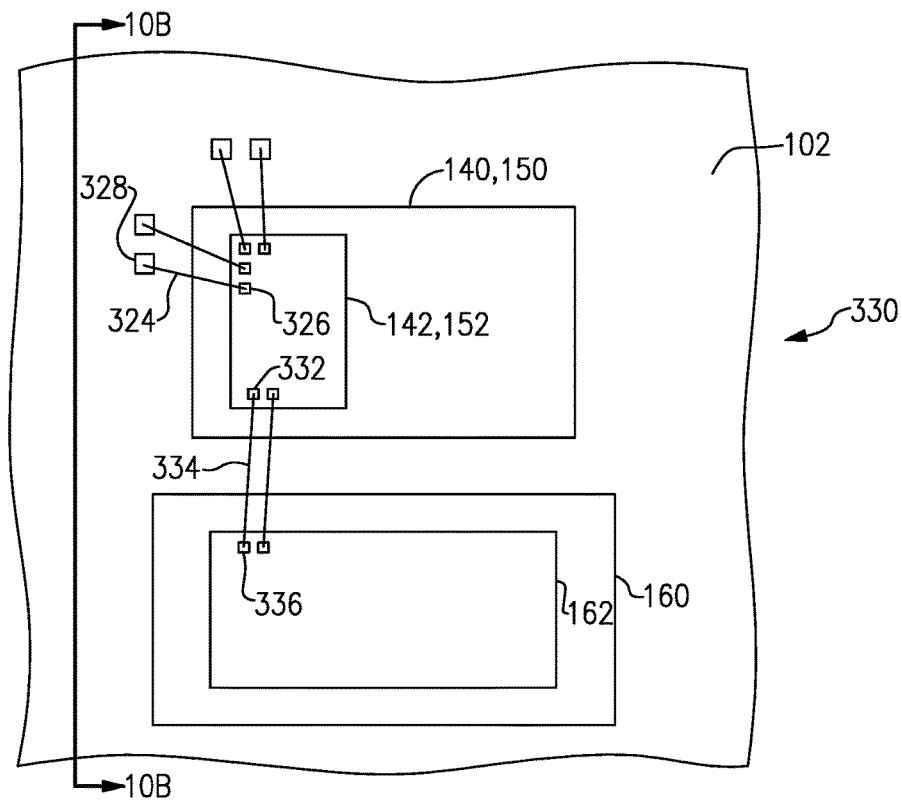
FIGS. 10A and 10B show plan and side views of an example configuration where an OMN device can be positioned relatively close to the PA die.
Figure 10B:
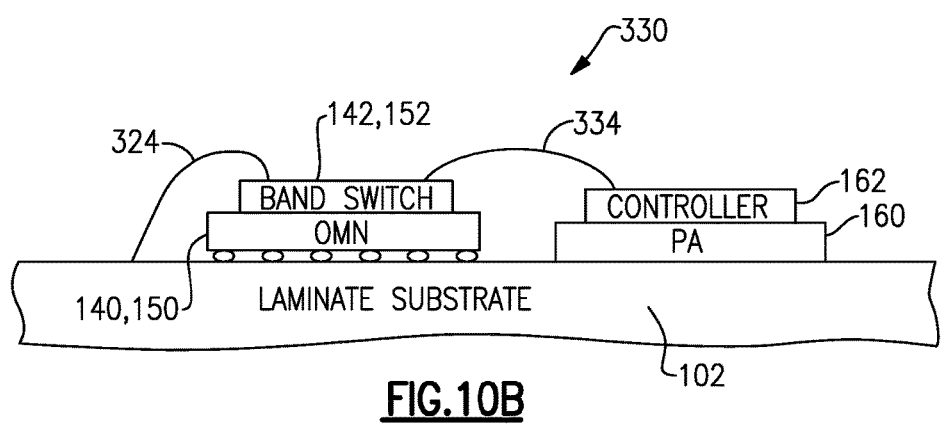

As described in reference to FIG. 6, the HBT PA die and an OMN device are preferably positioned relatively close to each other. FIGS. 10A and 10B show plan and side views of an example configuration 330 where an OMN device (140 or 150) is shown to be positioned relatively close to the HBT PA die 160. More particularly, electrical connections between the band selection switch (142 or 152) stacked above the OMN device and the controller die 162 stacked above the HBT PA die 160 can be implemented by "flying" wirebonds 334. Such wirebonds are shown to be formed between contact pads 332 on the band selection switch (142 or 152) and contact pads 336 on the controller die 162. Such wirebonds in effect, can create another routing layer in space above the laminate substrate 102.

For the purpose of description, it will be understood that the PA die 160 and the OMN device (140 or 150) of FIGS. 6 and 10 being relative close can include, for example, a configuration where the PA die 160 and the OMN device are positioned adjacent to each other, a configuration where a single wirebond can provide an electrical interconnection between a stack associated with the PA die 160 and a stack associated with the OMN device (140 or 150), or any combination thereof. In the context of a single wirebond interconnecting the two stacks, such a wirebond can be, for example, the flying wirebond described in reference to FIGS. 10A and 10B. It will be understood that such a single wirebond can also include other configurations involving the two stacks. For example, such a single wirebond can provide interconnection between any layer of the first stack and any layer of the second stack.

As described herein, the flip-chip configuration of the OMN devices 140, 150 can provide a relatively large platform for stacking, for example one or more band switch die thereon. In some embodiments, there may be sufficient space on such a flip-chip OMN device to stack another device aside from the band switch die.

Figure 11A:
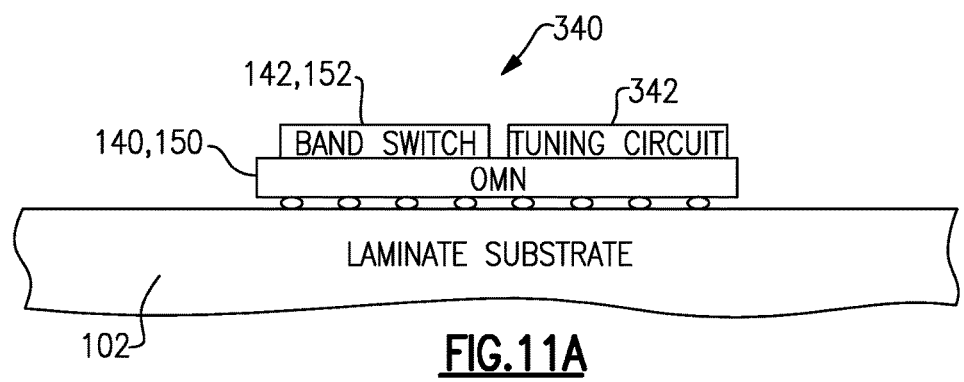
FIGS. 11A and 11B show side and plan views of an example configuration where an additional device such as a tuning circuit can be stacked on the OMN device.
Figure 11B:
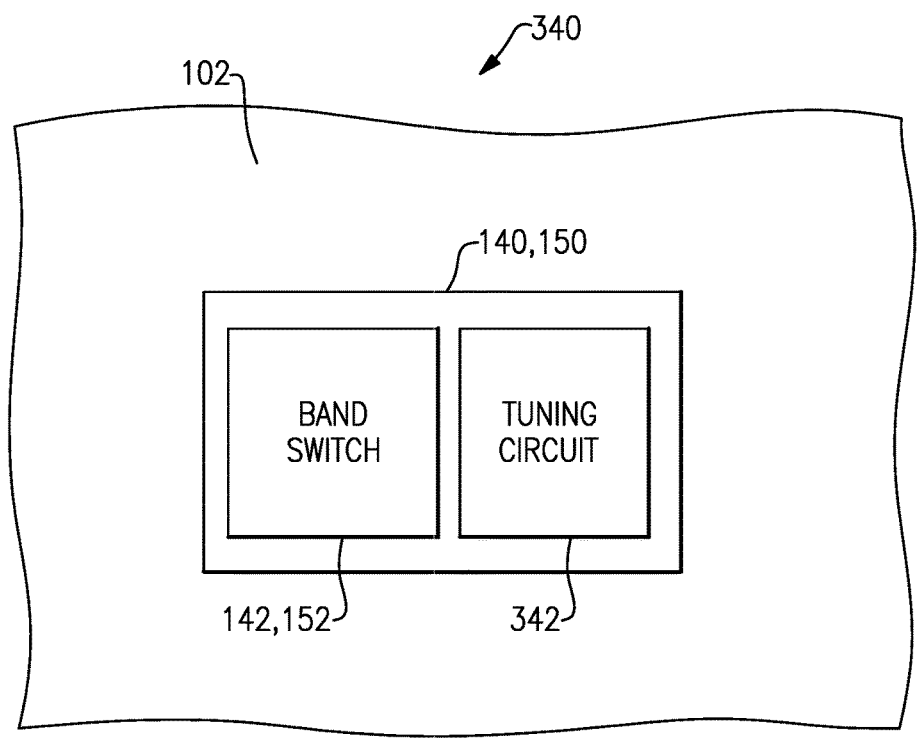

FIGS. 11A and 11B show side and plan views of an example configuration 340 where an additional device is stacked on an OMN device (140 or 150). A band switch die (142 or 152) is also shown to be stacked on the OMN device. In some embodiments, such an additional device can include, for example, a tuning circuit. Such a tuning circuit can include, for example, harmonic tanks, and be implemented as a duplexer-tuning IPD. Positioning such an IPD above the OMN device provides additional space saving on the laminate substrate 102.

Figure 12:
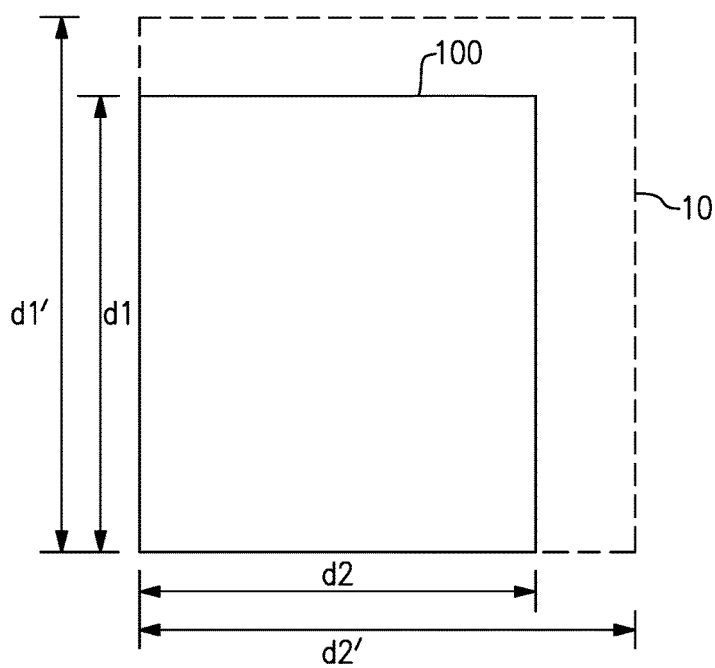
FIG. 12 shows an example of reduction in the lateral dimensions of a module that can result from space savings provided by stacking of components as described herein.

FIG. 12 shows an example of reduction in the lateral dimensions of a module that can result from space savings provided by stacking of components as described herein. A module 100 having one or more features as described herein is compared to a module 10 without such features. The module 10 is shown to have lateral dimensions of d1'×d2'; while the module 100 is shown to have reduced dimensions of d1×d2. For example, a multimode, multiband (MMMB) PA module without the stacking features as described herein can have lateral dimensions of approximately 5 mm×7 mm. A PA module implemented using one or more stacking features as described herein (including the two extra 3G/4G paths for improved performance) can have lateral dimensions of approximately 4 mm×7 mm, which is an approximately 20% reduction in lateral size.

Figure 13:
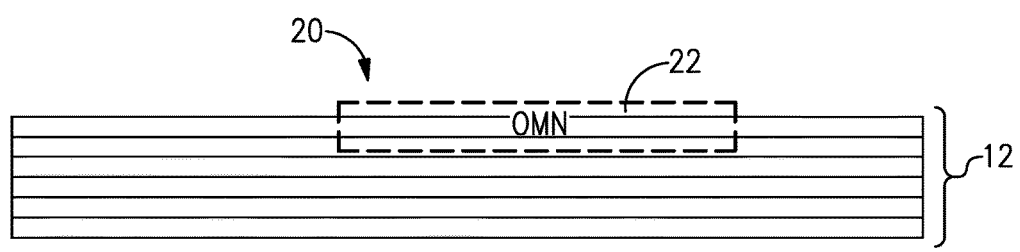
FIG. 13 shows an example laminate substrate having a number laminate layers, with some or all of matching network circuits being implemented in one or more of such laminate layers.
Figure 14:
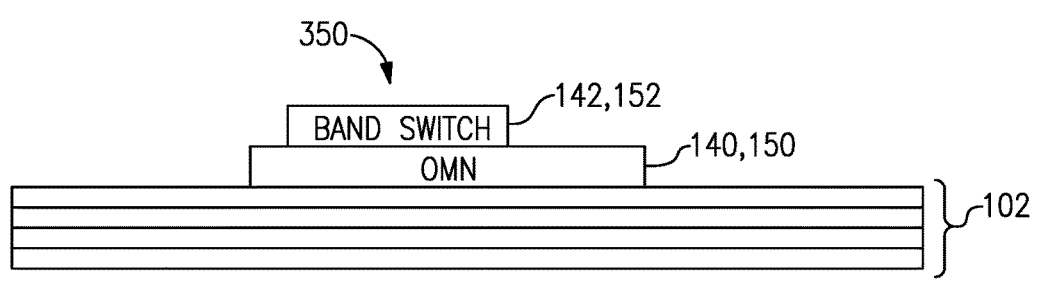
FIG. 14 shows that an OMN device being implemented on a laminate substrate as described herein allows reduction of amount of lateral space and/or number of layers associated with the laminate substrate.

FIGS. 13 and 14 show another advantageous feature that can result in modules having one or more features as described herein. FIG. 13 shows an example configuration 20 without such features, and FIG. 14 shows an example configuration 350 with such features. For particularly, FIG. 13 shows a laminate substrate 12 having, for example six laminate layers. As is generally understood, some or all of matching network circuits can be implemented in one or more of such laminate layers. Accordingly, an example output matching network (OMN) 22 is depicted as being part of the laminate substrate 12.

In FIG. 14, an OMN device (140 or 150) can be implemented on a laminate substrate 102. Because such an OMN device can include some or all of the components and/or functionalities associated with the in-substrate portion of the OMN 22 (FIG. 13), amount of lateral space and/or layers in the laminate layer can be reduced. For example, the laminate substrate 12 in the example of FIG. 13 includes six layers; while the laminate substrate 102 in the example of FIG. 14 includes four layers. Such a significant reduction in the number of laminate layers can provide a number of advantages, including, reduction in height of the module and reduction in costs associated with the module (e.g., cost associated with the laminate substrate).

In some embodiments, a module having one or more features as described herein can include RF shielding features. Such shielding features can include, for example, conformal shielding, shielding wirebonds, components that provide grounding connection(s) between an upper shielding layer and a ground plane, or some combination thereof.

Figure 15:
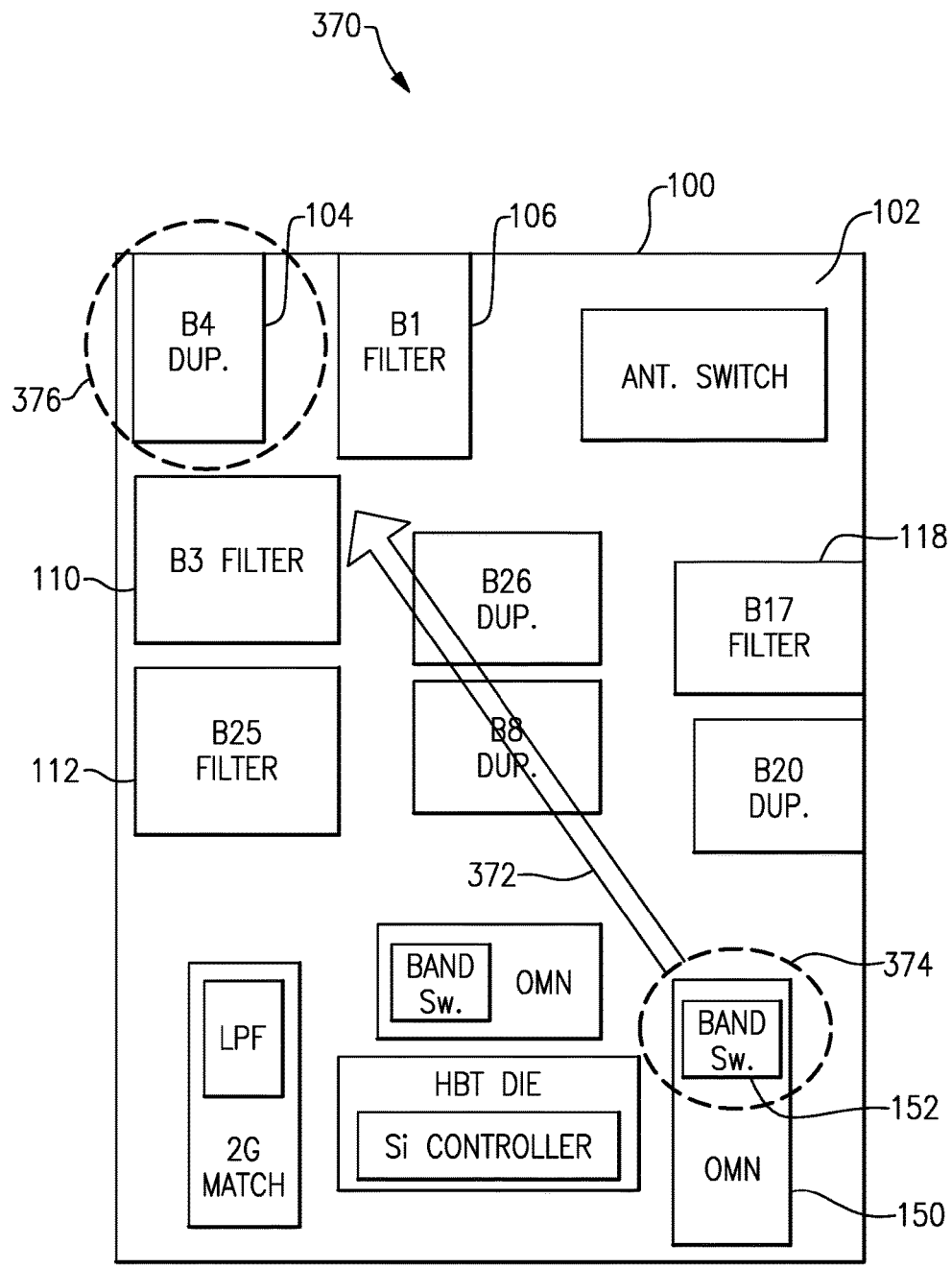
FIG. 15 shows a configuration which is similar to the example layout of the module described in reference to FIG. 1, where RF shielding functionality can be provided between different locations within the module.

FIG. 15 shows a configuration 370 which is similar to the example layout of the module 100 described in reference to FIG. 1. In the example configuration 370, some or all of the filter devices (e.g., B1 filter 106, B3 filter 110, B25 filter 112 and B17 filter 118) can be configured to provide conduction paths between their upper portions and lower portions, thereby facilitating shielding functionality. Additional details concerning such shielding are described in U.S. Patent Application Publication No. 2014/0308907 entitled APPARATUS AND METHODS RELATED TO GROUND PATHS IMPLEMENTED WITH SURFACE MOUNT DEVICES, which is expressly incorporated by reference in its entirely, and which is to be considered part of the specification of the present application.

In the example of FIG. 15, compartmentalized shielding within the module 100 can be provided. For example, third harmonic radiation from operation of B17 band (e.g., from an area 374 associated with the band switch 152) can interfere with operation of B4 Rx operation (e.g., in an area 376 associated with the B4 duplexer 104). Such undesirable radiation from the area 374 to the area 376 is depicted as an arrow 372. Such radiation is shown to be shielded or reduced by the arrangement of, for example, the B1 filter 106 and the B3 filter 110.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 16:
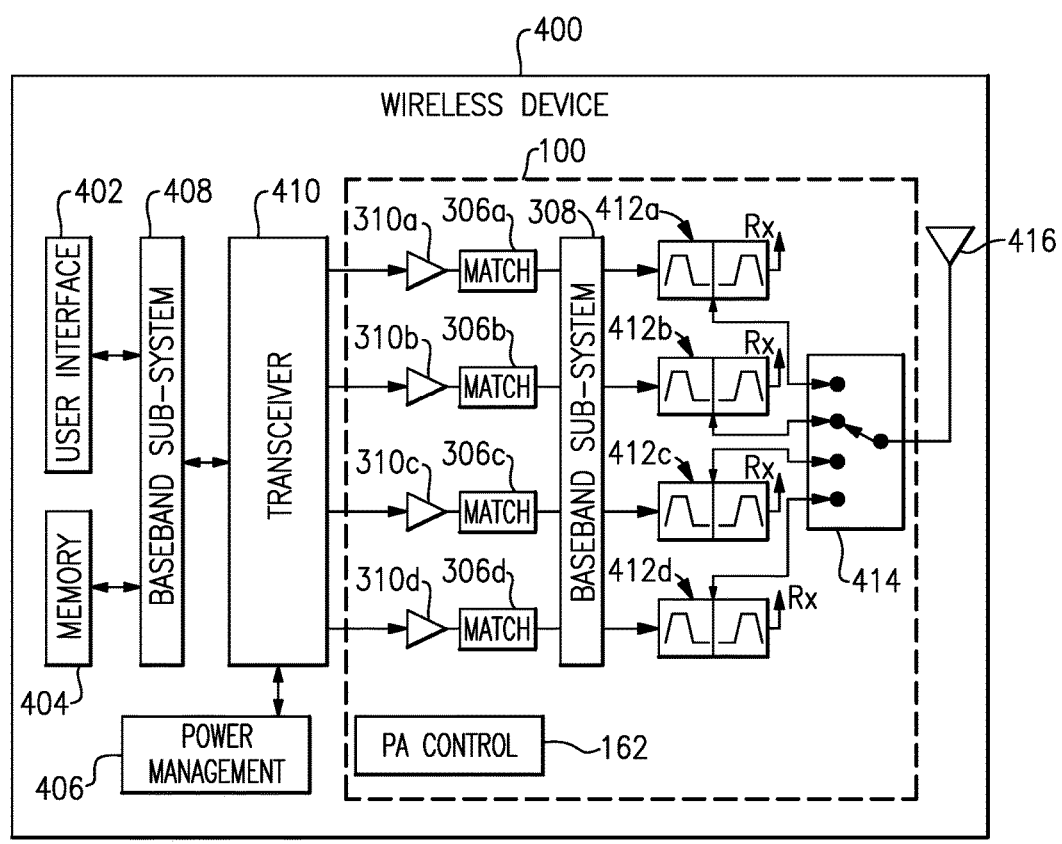
FIG. 16 depicts an example wireless device having one or more advantageous features described herein.

FIG. 16 schematically depicts an example wireless device 400 having one or more advantageous features described herein. In the context of a module having one or more features as described herein, such a module can be generally depicted by a dashed box 100, and can be implemented as a front-end module (FEM) such as a FEM-including-duplexer (FEMiD).

PAs 310 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 310 are shown to be matched (via respective match circuits 306) and routed to an antenna 416 through a band selection switch 308, their respective duplexers 412 and an antenna switch 414. In some embodiments, each duplexer 412 can allow transmit and receive operations to be performed simultaneously using a common antenna (e.g., 416). In FIG. 16, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

FIGS. 17-24 show non-limiting examples of various circuits, devices, architectures, and/or methods that can be implemented to facilitate one or more features of the present disclosure. Although described in the context of such features, it will be understood that such circuits, devices, architectures, and/or methods can also be implemented in other types of, for example, PA systems and packaging applications.

Figure 17:
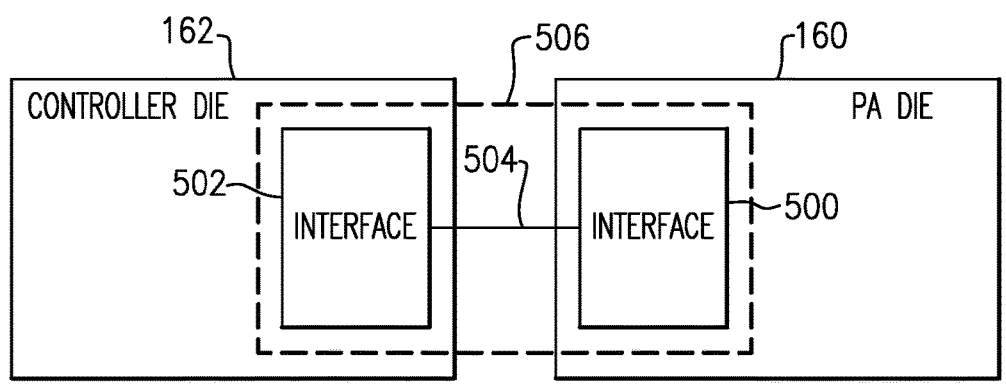
FIG. 17 shows a block diagram of an interconnect configuration that can be implemented between a controller die as described herein and a PA die also as described herein.

FIG. 17 shows a block diagram of an interconnect configuration 506 that can be implemented between a controller die 162 as described herein and a PA die 160 also as described herein. The controller die 162 can include an interface portion 502 configured to facilitate interconnection with, for example, the PA die 160. The PA die 160 can include an interface portion 500 configured to facilitate interconnection with, for example, the controller die 162.

In FIG. 17, the interconnection between the interfaces 502, 500 of the controller die 162, 160 is depicted as a line 504. As described herein in a more specific example of FIG. 18, such an interconnection can include one or more wirebonds (e.g., one or more wirebonds 244 in FIGS. 5A and 5B).

FIG. 18 shows an example of an interconnect configuration 506 that can be implemented. Interface portions 502, 500 corresponding to the controller die and the PA die are indicated. In the example of FIG. 18, a wirebond 244 can provide functionalities associated with the interconnection 504 of FIG. 17. The example configuration shown in FIG. 18 can reduce the number of input/output connections between the stacked Si controller die (e.g., 162 in FIGS. 5A and 5B) and HBT PA die (e.g., 160 in FIGS. 5A and 5B). Accordingly, such a reduction in the number of connections can yield reduced die size(s) in either of both of the controller die and the PA die.

The example in FIG. 18 can be configured and operated to yield tri-level logic states for controlling various operations of the PA circuit in the PA die. An example of such logic outputs are shown in FIG. 19. For example, a first level can include a V_input of approximately 0V; and when such a voltage level is provided to the interface 500, both of outputs OUT1 and OUT2 can have high logic states. A second level can include a V_input of approximately 1.65V; and when such a voltage level is provided to the interface 500, OUT1 can be in a low logic state, and OUT2 can be in a high logic state. A third level can include a V_input of approximately 3V; and when such a voltage level is provided to the interface 500, both of OUT1 and OUT2 can have low logic states.

Figure 20:
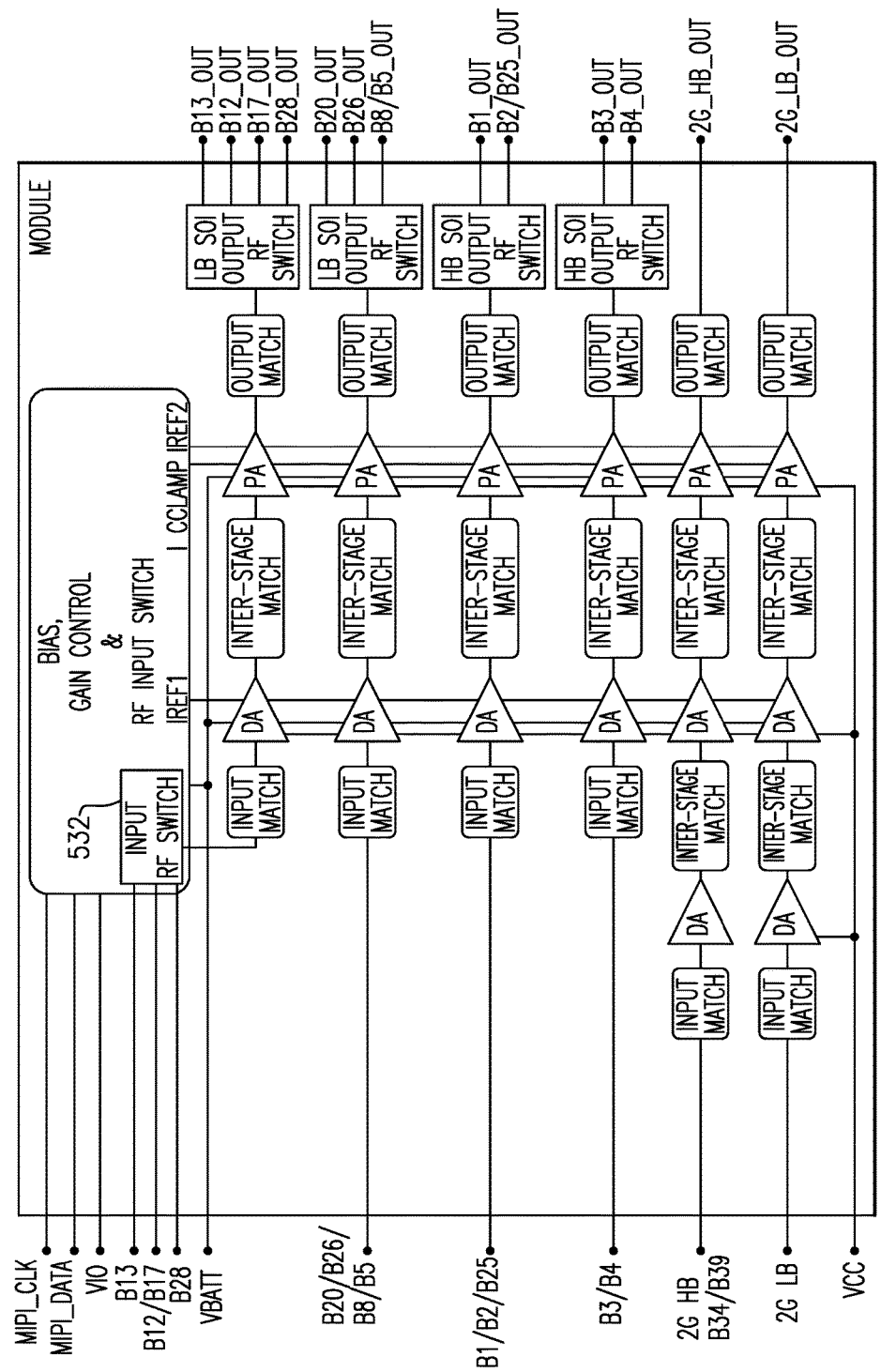
FIG. 20 shows a PA control configuration where a reference current (Iref) can be shared among, for example, driver stages and output stages so as to provide, for example, a reduction of I/O connections between the PA die and the Si controller die, a reduction in the number and/or size of associated filters, and a reduction in the sizes of the PA and/or controller die.

As described herein (e.g., in reference to FIG. 7), a PA can include two or more amplification stages. For example, a driver stage can be followed by an output stage. FIG. 20 shows a PA control configuration 510 where a reference current (Iref) can be shared among, for example, the driver stages and the output stage. Such a configuration can provide a number of desirable features, including a reduction of I/O connections (e.g., wirebonds) between the HBT PA die and the Si controller die, a reduction in the number and/or size of associated filters, and sizes of the PA and/or controller die.

Figure 21:
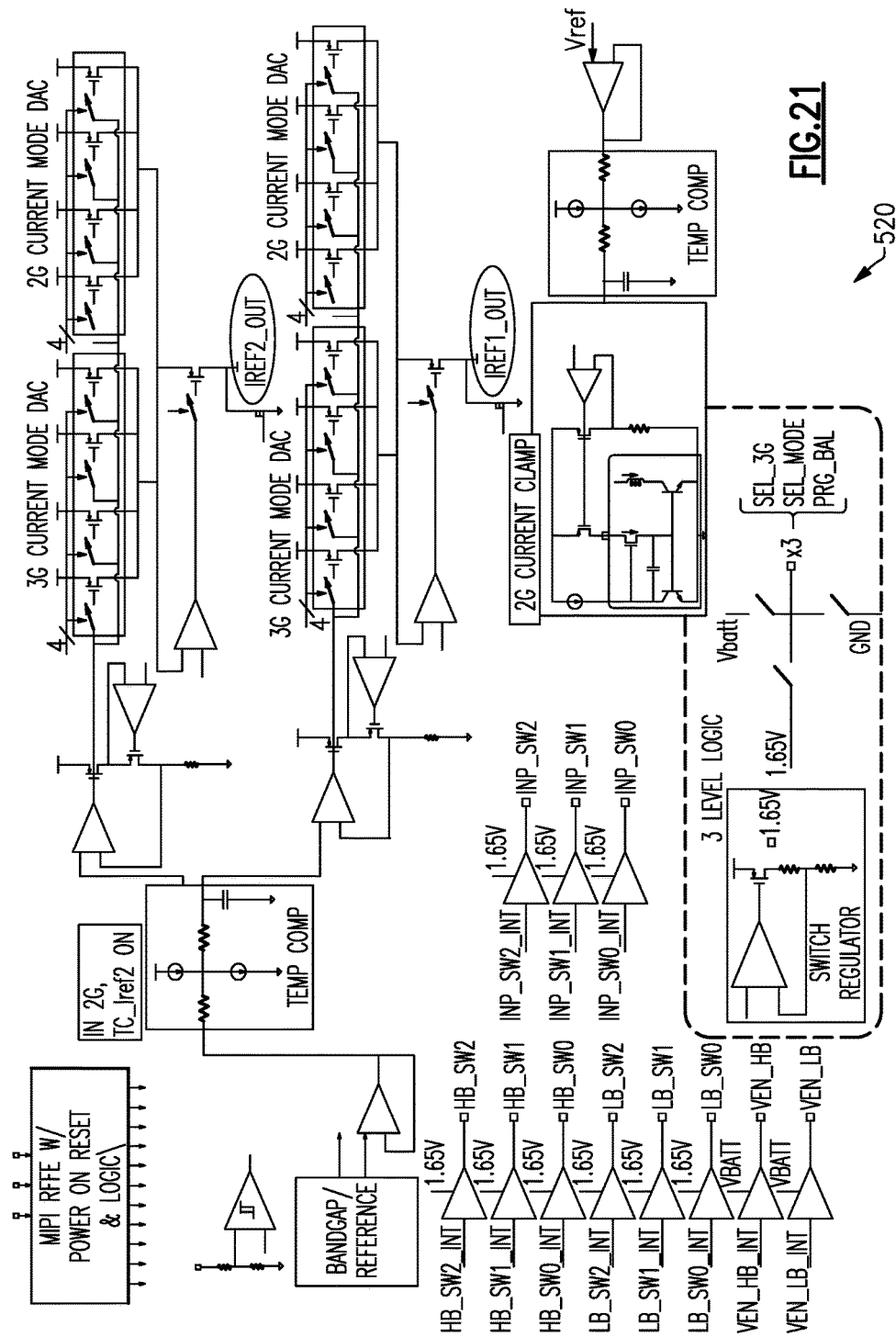
FIG. 21 shows an example PA control architecture that can be implemented to include and/or facilitate, for example, the shared Iref feature of FIG. 20 and the tri-level logic feature of FIGS. 18 and 19.

FIG. 21 shows an example PA control architecture 520 that can be implemented to include and/or facilitate, for example, the shared Iref feature of FIG. 20 and the tri-level logic feature of FIGS. 18 and 19.

Figure 22:
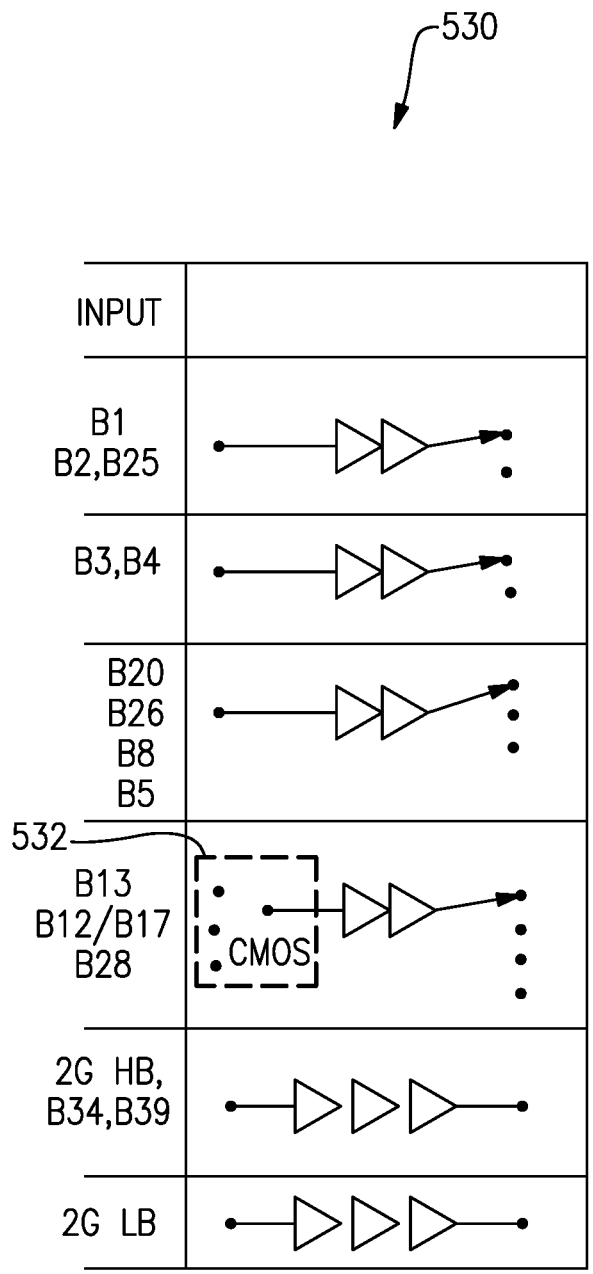
FIG. 22 shows an example PA configuration that can include an input switch which can be implemented as a CMOS device incorporated into, for example, the stacked Si controller die.

FIG. 22 shows an example PA configuration 530 that includes an input switch 532. In FIG. 20, such an input switch is also indicated as 532. Such an input switch can be implemented as a CMOS device incorporated into, for example, the stacked Si controller die (e.g., 162 in FIGS. 4 and 5). Such an input switch being part of the Si controller die can be desirable, since implementing it in a separate die can consume more space on the module.

FIG. 23A shows an example PA configuration 540 where a Y1 capacitance (e.g., a capacitor) 570 can be shared among a plurality of PAs. In the example shown, three PAs 542, 552, 562 share the common Y1 capacitance 570. Since the Y1 capacitance 570 is typically a large surface mounted device (e.g., typically 10,000 pF), sharing of such a capacitance can save space in the module.

In some embodiments, tank circuits 544, 554, 564 can be provided and tuned to block the associated PA frequency band due to, for example, BiFET switch leakage. In some embodiments, switches 546, 556, 566 can be provided and configured to inhibit or reduce loading in other bands.

FIG. 23B shows an example PA configuration 580 where each of three example PAs 582, 584, 586 can have its own separate Y1 capacitance (e.g., a capacitor) 592. As described in reference to FIG. 23A, such separate Y1 capacitors can occupy more space than the single common Y1 capacitor.

Figure 24B:
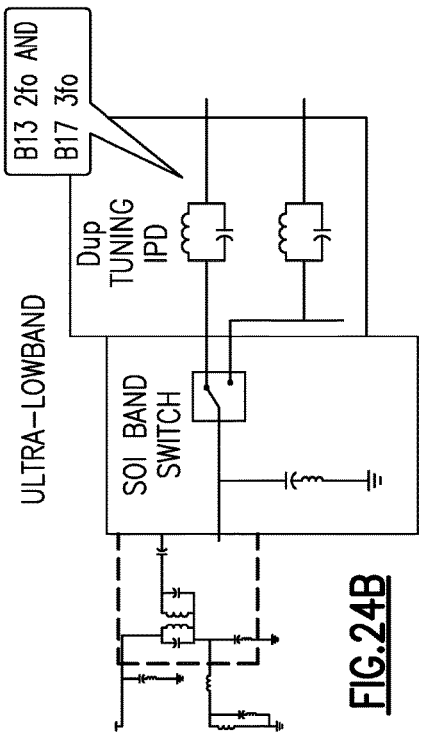
FIGS. 24A-24D show examples of harmonic tank circuits that can be implemented in, for example, the tuning circuit of FIGS. 11A and 11B.
Figure 24A:
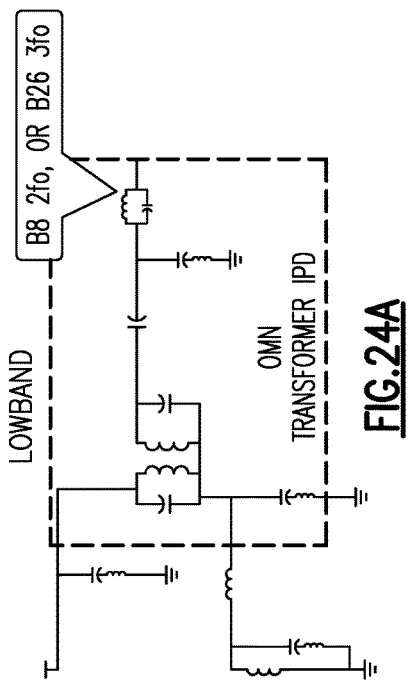
Figure 24D:
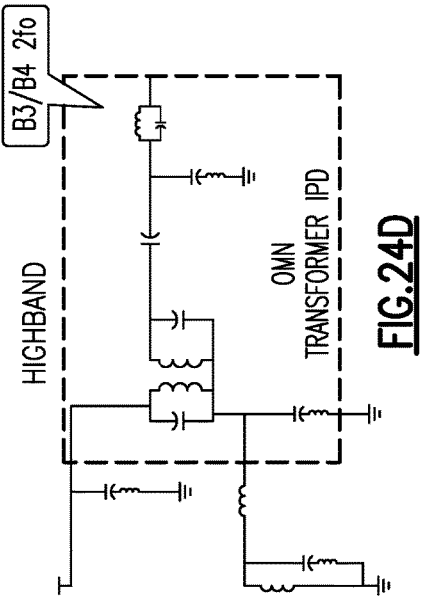
Figure 24C:
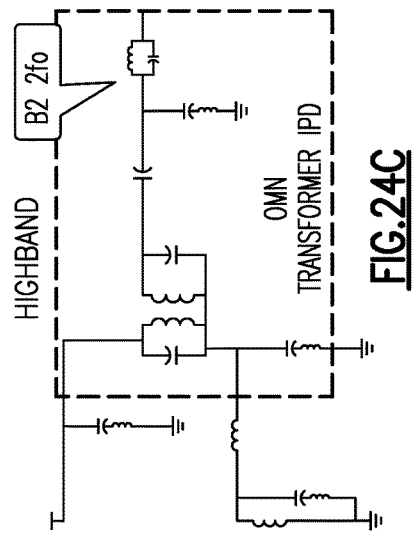

FIGS. 24A-24D show examples of harmonic tank circuits that can be implemented in, for example, the tuning circuit 342 of FIGS. 11A and 11B. FIG. 24A shows an example harmonic tank circuit that can be tuned to, for example, second harmonic of band B8 or third harmonic of band B26. Such a circuit can be implemented as a transformer-based IPD. FIG. 24B shows an example harmonic tank circuit that can be tuned to, for example, second harmonic of band B13 or third harmonic of band B17. Such a circuit can be implemented as an IPD, and can be utilized along with a band switch (e.g., an SOI switch) stacked over an OMN device. FIG. 24C shows an example harmonic tank circuit that can be tuned to, for example, second harmonic of band B2. Such a circuit can be implemented as a transformer-based IPD. FIG. 24D shows an example harmonic tank circuit that can be tuned to, for example, second harmonic of bands B3/B4. Such a circuit can be implemented as a transformer-based IPD.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) module comprising:
   a packaging substrate configured to receive a plurality of components;
   a power amplifier (PA) assembly comprising a plurality of power amplifiers implemented on the packaging substrate;
   an output matching network (OMN) device mounted on the packaging substrate; and
   a band selection switch device mounted on the OMN device.

2. The radio-frequency module of claim 1 wherein the output matching network device includes a plurality of output matching network circuits configured to provide output matching functionality for at least a portion of the power amplifier assembly and for a respective plurality of frequency bands.

3. The radio-frequency module of claim 1 wherein the output matching network device is configured for 3G/4G operation and is implemented as an integrated passive device (IPD) mounted on the packaging substrate in a flip-chip configuration.

4. The radio-frequency module of claim 3 wherein the band selection switch device is implemented on a silicon-on-insulator (SOI) die mounted on the output matching network device.

5. The radio-frequency module of claim 1 further comprising a tuning circuit mounted on the output matching network device.

6. The radio-frequency module of claim 5 wherein the tuning circuit is implemented as an integrated passive device (IPD) mounted on the output matching network device.

7. The radio-frequency module of claim 1 wherein the band selection switch device and the packaging substrate are interconnected by one or more wirebonds.

8. The radio-frequency module of claim 1 further comprising a controller configured to provide at least some control of the power amplifier assembly.

9. The radio-frequency module of claim 8 wherein the controller and the band selection switch device are interconnected by one or more flying wirebonds.

10. The radio-frequency module of claim 8 wherein the controller is implemented on a controller die mounted on a power amplifier die comprising the power amplifier assembly.

11. The radio-frequency module of claim 10 wherein the power amplifier die is a gallium arsenide (GaAs) die implementing a plurality of heterojunction bipolar transistor (HBT) power amplifiers.

12. The radio-frequency module of claim 11 wherein the heterojunction bipolar transistor power amplifiers include a plurality of power amplifiers configured for 3G/4G operation.

13. The radio-frequency module of claim 12 wherein the heterojunction bipolar transistor power amplifiers further include a plurality of power amplifiers configured for 2G operation.

14. The radio-frequency module of claim 1 wherein the power amplifier assembly and the output matching network device are positioned adjacent to each other.

15. The radio-frequency module of claim 14 wherein output ports of a power amplifier die comprising the power amplifier assembly are aligned with corresponding input ports of the output matching network device.

16. The radio-frequency module of claim 15 further comprising:
   an additional output matching network device mounted on the packaging substrate adjacent to the power amplifier die and configured to provide output matching functionality for at least an additional portion of the power amplifier assembly; and
   an additional band selection switch device mounted on the additional output matching network device.

17. A method for fabricating a radio-frequency (RF) module, the method comprising:
   obtaining a packaging substrate configured to receive a plurality of components;
   mounting a power amplifier (PA) assembly of a plurality of power amplifiers on the packaging substrate;
   mounting an output matching network (OMN) device on the packaging substrate; and
   stacking a band selection switch on the output matching network device.

18. The method of claim 17 wherein mounting the output matching network device of the packaging substrate includes forming one or more flip-chip connections.

19. The method of claim 17 further comprising interconnecting the power amplifier assembly and the output matching network die.

20. A wireless device comprising:
   a transceiver configured to generate a radio-frequency (RF) signal;
   a front-end module (FEM) in communication with the transceiver, the front-end module including a packaging substrate configured to receive a plurality of components, the front-end module further including a power amplifier (PA) assembly comprising a plurality of power amplifiers mounted on the packaging substrate, the front-end module further including an output matching network (OMN) device mounted on the packaging substrate, the front-end module further including a band selection switch device mounted on the output matching network device; and an antenna in communication with the front-end module and configured to transmit the amplified radio-frequency signal.

* * * * *